United States Patent [19]

Lee

[11] Patent Number: 5,201,991
[45] Date of Patent: Apr. 13, 1993

[54] PROCESS FOR FORMATION OF CAPACITOR

[75] Inventor: Chang-Jae Lee, Seoul, Rep. of Korea

[73] Assignee: Goldstar Electron Co., Ltd., Rep. of Korea

[21] Appl. No.: 659,004

[22] Filed: Feb. 21, 1991

[30] Foreign Application Priority Data

Feb. 23, 1990 [KR] Rep. of Korea ............... 90-2345

[51] Int. Cl.⁵ .................. H01L 21/306; B44C 1/22; C03C 15/00; C03C 25/06
[52] U.S. Cl. .................. 156/643; 156/651; 156/653; 156/657; 156/659.1; 156/662; 437/52; 437/191; 437/233; 257/296
[58] Field of Search ............ 156/643, 651, 653, 657, 156/659.1, 662; 357/23.6, 51, 59; 437/40, 41, 52, 191, 233

[56] References Cited

U.S. PATENT DOCUMENTS 4,700,457 10/1987 Matsukawa ............. 437/52
5,061,651 10/1991 Ino ........................... 437/52

Primary Examiner—William A. Powell
Attorney, Agent, or Firm—Blakely Sokoloff Taylor & Zafman

[57] ABSTRACT

A process for formation of a multi-stack type capacitor is disclosed, which comprises: steps of forming a polysilicon layer 5 on a source, forming a dielectric 5a, forming a layer 6, and forming a dielectric layer 6a in the cited order; step of self-aligning a contact pattern for connecting the layer 5 and the layer 7; step of carrying out an etching so as for the layer 5 and the layer 7 to be connected later; steps of forming the layer 7, and forming a dielectric layer 7a; step of self-aligning a contact pattern for connecting the layer 6 and a layer 8; step of carrying out an etching so as for the layer 6 and the layer 8 to be connected later; and step of forming the layer 8, the above steps being repeated in order to form a multi-stack type capacitor of a sandwiched form. According to the present invention, the device is protected from the etch damage, and is suitable for use in a high density memory device.

1 Claim, 3 Drawing Sheets

PROCESS FOR FORMATION OF CAPACITOR

FIELD OF THE INVENTION

The present invention relates to a process for formation of a capacitor as a memory device, and particularly to a process for formation of a capacitor which is formed by stacking multiple polysilicon layers, and which is suitable for use in a high density memory device.

BACKGROUND OF THE INVENTION

The conventional device is constituted such that, as shown in FIG. 1, a polysilicon layer 11 is let to form a node, and is bury-contacted to an N+ drain 4b, and upon the polysilicon layer 11, there is formed a dielectric layer 12 (nitride layer/oxide layer) by applying a thermal growing process, while a polysilicon plate 13 is formed upon the dielectric layer 12, thereby forming a single type capacitor.

That is, as shown in FIG. 1, according to the conventional device, the area of the dielectric layer 12 constitutes the area of the capacitor area, an the single type capacitor consists of the polysilicon layer 11 (node polysilicon layer) and the polysilicon 13 (plate polysilicon layer).

In FIG. 1, element code 3 indicates an LT01 oxide layer which forms the side wall of the gate, element code 15 indicates stacked polysilicon layers which are stacked in order to increase the length of the capacitor in the vertical direction, element code 16 indicates an LT02 layer (Low Temperature Oxide layer) which is formed on the polysilicon layer 13, and element code 17 indicates a BPSG layer (Boro-Phosphor-Silicate glass layer) which is formed on the LT02 layer 16.

The conventional technique described above has disadvantages such that the reliability of the device is lowered due to the etch damages which are liable to occur during the etching of the trench of the polysilicon layer 15, that step coverage problems occur during the formation of the multiple thin layers because of the large vertical/horizontal aspect ratio, and that a difficulty is encountered in increasing the capacitance of the high density device under a limited space.

As more advanced techniques, there have been developed a T type double stacked capacitor by Hitachi company and a fin type stacked capacitor by Fujitsu company. However, these techniques are complicated and highly fastedious, and also include many different processes in practice.

SUMMARY OF THE INVENTION

The present invention is intended to overcome the above described disadvantages of the conventional techniques.

Therefore it is the object of the present invention to provide a process for formation of a multi-stack type capacitor which is formed by stacking multiple polysilicon layers.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

Figure 1:
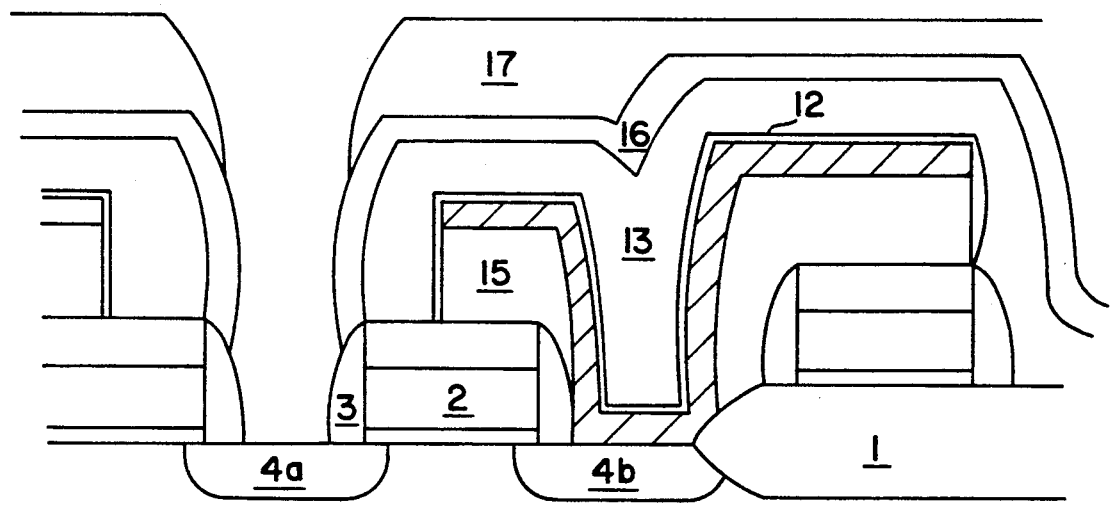
FIG. 1 illustrates the conventional capacitor structure for use as a memory device.
Figure 2A:
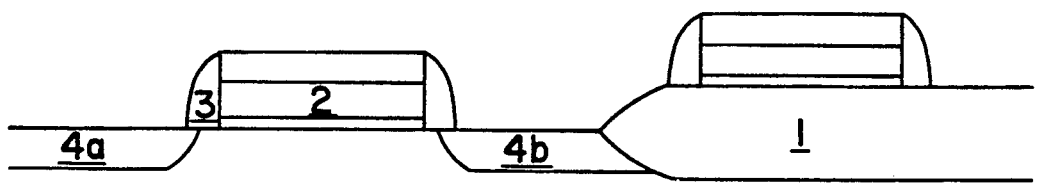
FIGS. 2(A)–2(G) illustrate the manufacturing processes for the memory capacitor according to the present invention.
Figure 2B:
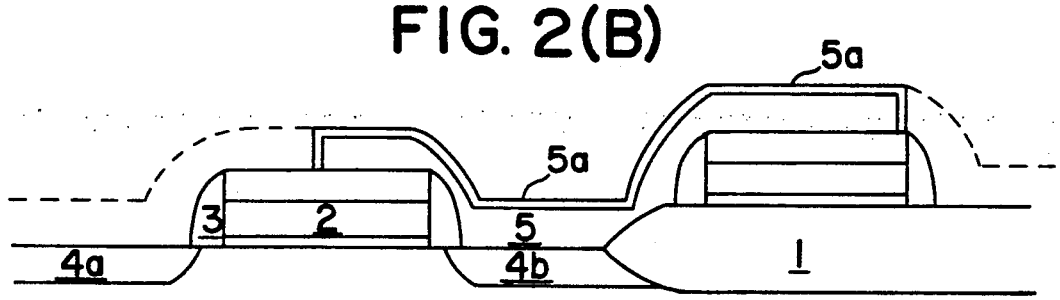
Figure 2C:
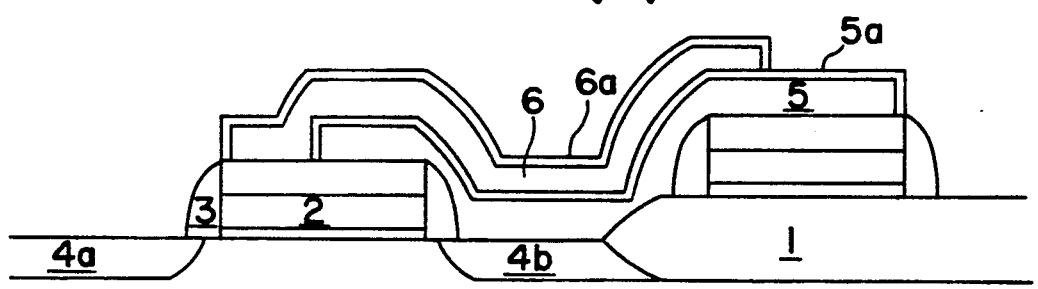

First, as shown in FIG. 2A, a field oxide layer 1, a gate 2, an LTO oxide layer (side wall) 3, a drain 4a and a source 4b are formed based on the conventional methods. Then as shown in FIG. 2B, a polysilicon layer 5 (first node silicon layer) is formed on the source 4b, the polysilicon layer 5 is photo-etched, and a dielectric layer 5a is thermally grown on the polysilicon layer 5. Then as shown in FIG. 2C, a polysilicon layer 6 (first plate polysilicon layer) is formed, the polysilicon layer 6 is photo-etched, and a dielectric layer 6a is thermally grown on the polysilicon layer 6.

Figure 2D:
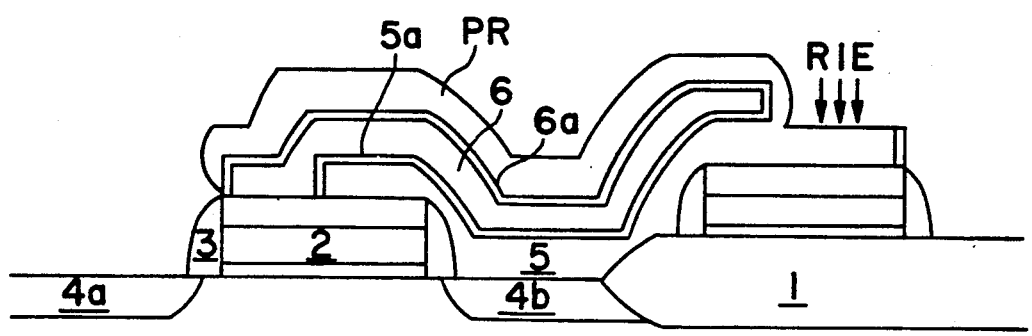

Then as shown in FIG. 2D, a photo process is applied using a poly 6 mask which is expanded less than 0.1 μm. (here, the pattern which connects the polysilicon layer 5 and the polysilicon layer 7 is self-aligned). Then, a photo resist (PR) is reflowed, and the dielectric layer 5a is etched by applying the RIE (Reactive Ion Etching) method.

Figure 2E:
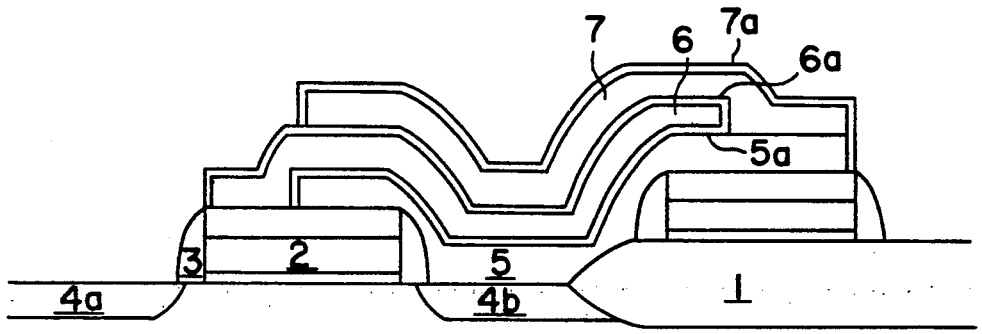

Then, as shown in FIG. 2E, the photo resist is removed a second node polysilicon layer 7 is formed (here, the first node polysilicon layer 5 and the second node polysilicon layer 7 are connected to each other because the dielectric layer 5a is etched by applying the RIE technique), the polysilicon layer 7 is photo-etched, and a dielectric layer 7a is thermally grown thereon.

Figure 2F:
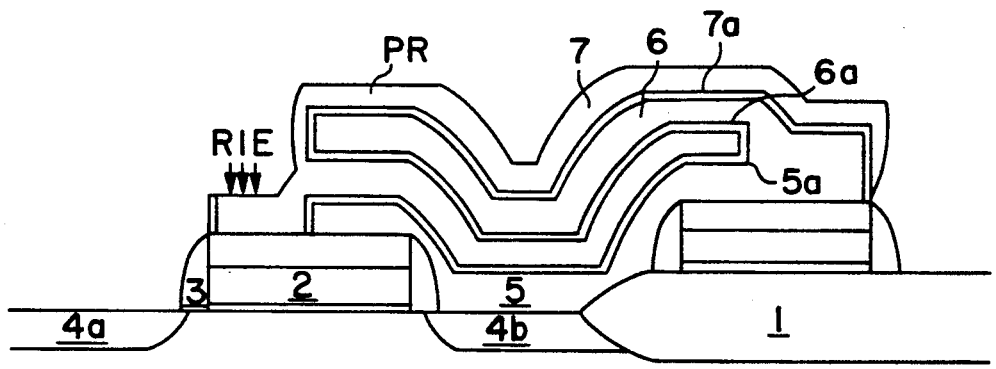

Then as shown in FIG. 2F, a photo process is carried out using a poly 7 mask which is expanded less than 0.1 μm (here, the contact pattern which connects the polysilicon layer 6 and the polysilicon layer 8 is self-aligned). Then, the photo resist is reflowed, and the dielectric layer 6a is etched by applying the RIE technique.

Figure 2G:
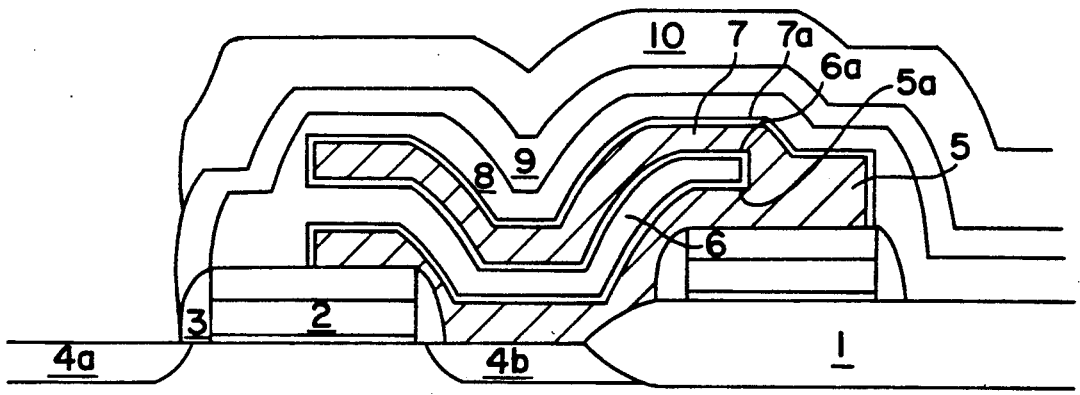

Then, as shown in FIG. 2G, the photo resist is removed (here, the first plate polysilicon layer 6 and the second plate polysilicon layer 8 are connected to each other, because the dielectric layer 6a is etched by applying the RIE technique), and the, the polysilicon layer 8 (second plate layer) is formed, and photo-etched.

Through the processes described above, multiple polysilicon layers are stacked, and the layers are connected in parallel, thereby forming a multi-stack type capacitor. After the formation of the polysilicon layer 8 as shown in FIG. 2F, an LTO layer 9 and a BPSG layer 10 are formed in a sequential manner. Thus according to the present invention, trench-etchings are not carried out, and therefore, the device is protected from the problem of the etch-damage. Further, the step coverage is improved because the vertical/horizontal aspect ratio is not large compared with the existing ones.

Still further, the total capacitance of the capacitor is increased to a great degree, because the multiple electrodes are connected in parallel within a limited space, and therefore, the capacitor according to the present invention is suitable for use in a high density memory device. Further, the large capacitance of the capacitor of the present invention contributes to reducing the soft-errors which are induced by α particles, (radio active ray from package), and the manufacturing processes are also rendered easy to carry out.

What is claimed is:

1. A process for formation of capacitor comprising steps of:

forming a field region and an active region on a substrate;

forming a gate with a sidewall on a field region and an active region, respectively;

forming a source region and a drain region by implanting impurities in two predetermined regions of said substrate and then diffusing said impurities;

forming a first storage node polysilicon over the exposed whole surface;

defining said first storage node polysilicon so that said first storage node polysilicon is only remained between a gate of said active region and a gate of said field region;

forming a first dielectric layer on said defined first storage node polysilicon;

forming a first plate node polysilicon over the exposed whole surface;

defining said first plate node polysilicon so that said first plate node polysilicon is only remained between a gate of said active region and a gate of said field region and simultaneously a predetermined part of said first dielectric layer is exposed;

removing the exposed part of said first dielectric layer;

forming a second dielectric layer over the exposed whole surface;

forming a second storage node polysilicon contacted with said first storage node polysilicon through the removed part of said first dielectric layer;

defining said second storage node polysilicon so that it is only remained between a gate of said active region and a gate of said field region and simultaneously a predetermined part of said second dielectric layer is exposed;

removing the exposed part of said second dielectric layer;

forming a third dielectric layer on said defined second storage node polysilicon; and forming a second plate node polysilicon contacted with said first plate node polysilicon through the removed part of second dielectric layer.

* * * * *